(12) United States Patent
Cutshall et al.

(10) Patent No.: US 12,372,615 B2
(45) Date of Patent: Jul. 29, 2025

(54) MULTI-TARGET NEAR-FIELD TEST SYSTEM

(71) Applicant: Raytheon Company, Waltham, MA (US)

(72) Inventors: Ryan T. Cutshall, Tucson, AZ (US); Eric Jeffrey Nill, Tucson, AZ (US)

(73) Assignee: Raytheon Company, Arlington, VA (US)

( * ) Notice: Subject to any disclaimer, the term of this patent is extended or adjusted under 35 U.S.C. 154(b) by 265 days.

(21) Appl. No.: 17/940,150

(22) Filed: Sep. 8, 2022

(65) Prior Publication Data

US 2024/0085523 A1    Mar. 14, 2024

(51) Int. Cl.
*G01S 7/40* (2006.01)
*G01R 29/10* (2006.01)

(52) U.S. Cl.
CPC .......... *G01S 7/4095* (2021.05); *G01R 29/105* (2013.01); *G01S 7/4008* (2013.01); *G01R 29/10* (2013.01)

(58) Field of Classification Search
CPC .... G01S 7/4004; G01S 7/4008; G01S 7/4021; G01S 7/4082; G01S 7/4086; G01S 7/4095; G01S 15/8915; G01S 7/4052; G01R 29/10; G01R 29/105; G01R 29/0821; G01R 29/0871; H01Q 3/2605; H01Q 3/2617; H01Q 3/267; H01Q 3/36
See application file for complete search history.

(56) References Cited

U.S. PATENT DOCUMENTS

| | | | |
|---|---|---|---|
| 5,136,300 A | 8/1992 | Clarke et al. | |
| 5,721,554 A * | 2/1998 | Hall | G01S 7/4052 342/170 |
| 7,471,237 B2 | 12/2008 | Wooldridge | |
| 10,581,150 B2 | 3/2020 | Heuel et al. | |
| 11,131,701 B1 * | 9/2021 | Mathis | G01R 29/105 |
| 2011/0128197 A1 * | 6/2011 | Sakata | G01R 29/10 343/703 |
| 2012/0225624 A1 * | 9/2012 | Kyosti | H04B 17/0087 455/67.11 |
| 2013/0052962 A1 * | 2/2013 | Hansen | G01R 29/105 455/67.12 |
| 2018/0080967 A1 * | 3/2018 | Lee | G01R 29/10 |
| 2019/0129026 A1 * | 5/2019 | Sumi | A61B 6/00 |
| 2019/0257931 A1 * | 8/2019 | Katakura | G01S 15/8902 |

(Continued)

FOREIGN PATENT DOCUMENTS

| CN | 209821290 U | 12/2019 |
|---|---|---|
| CN | 113960549 A | 1/2022 |

OTHER PUBLICATIONS

International Search Report and Written Opinion issued Nov. 9, 2023 in counterpart International App. No. PCT/US2023/027056.

(Continued)

*Primary Examiner* — Steven L Yeninas
(74) *Attorney, Agent, or Firm* — Bachman & LaPointe, P.C.

(57) ABSTRACT

A test system comprising an array of radiating antenna elements, each antenna element in the array operatively connected to a beam former; and at least one signal generator operatively connected to the beam former; wherein the test system is configured to generate simultaneous plane waves in the near-field region.

16 Claims, 2 Drawing Sheets

(56) References Cited

U.S. PATENT DOCUMENTS

| | | | |
|---|---|---|---|
| 2020/0358179 A1* | 11/2020 | Eriksson | H04B 17/104 |
| 2021/0341572 A1* | 11/2021 | Hamberger | G01S 7/4052 |
| 2022/0404462 A1* | 12/2022 | Bradstreet | H01Q 3/267 |
| 2023/0029048 A1* | 1/2023 | Hahn, III | H04B 17/0085 |

OTHER PUBLICATIONS

"Multiple Target, Dynamic RF Scene Generator", David J. Wayne et al., Aug. 1, 2016, pp. 1-6.

"Plane wave compensation technique for multiple-input multiple-output over-the-air testing in small multi-probe anechoic chamber", Heng Wang et al., IET Microwaves, Antennas & Propagation, the Institution of Engineering and Technology, United Kingdom, vol. 13, No. 15, May 22, 2019, pp. 2625-2631.

"A Survey on Hybrid Beamforming Techniques in 5G: Architecture and System Model Perspectives", IEEE Communications Surveys & Tutorials, vol. 20, No. 4, Aug. 1, 2016, pp. 3060-3097.

\* cited by examiner

MULTI-TARGET NEAR-FIELD TEST SYSTEM

BACKGROUND

The present disclosure is directed to improved radar test systems, particularly a near-field multi-target test system.

In radar production facilities, there is a desire for rapid tests performed on production radar systems to validate requirements and/or workmanship.

Current radar production facilities include radar test systems, such as the Hardware-in-the-Loop (HIL) chambers, that are very large, and are not well-suited for production lines. One example includes testing in anechoic chambers that are very large, and sometimes require their own building to be housed. Production testing is very limited, and testing on the production line may only present a single target to the radar from a fixed angular position, at a fixed range and Doppler.

What is needed is a near-field test system that can present multiple targets simultaneously to the radar-under-test that occupies a relatively small production space.

SUMMARY

In accordance with the present disclosure, there is provided a test system comprising an array of radiating antenna elements, each antenna element in the array operatively connected to a beam former; and at least one signal generator operatively connected to the beam former; wherein the test system is configured to generate simultaneous plane waves in the near-field region.

A further embodiment of any of the foregoing embodiments may additionally and/or alternatively include the beam former is selected from the group consisting of a phase shifter, a digital attenuator, a variable gain amplifier, and combinations thereof.

A further embodiment of any of the foregoing embodiments may additionally and/or alternatively include the beam former comprises a Monolithic Microwave Integrated Circuit.

A further embodiment of any of the foregoing embodiments may additionally and/or alternatively include the radiating antenna element is selected from the group consisting of a single-polarized antenna element and dual-polarized antenna element.

A further embodiment of any of the foregoing embodiments may additionally and/or alternatively include the array of radiating antenna elements is selected from the group consisting of a planar array, a cylindrical array, a spherical array and combinations thereof.

A further embodiment of any of the foregoing embodiments may additionally and/or alternatively include each radiating antenna element in the array is operatively connected to multiple phase shifters, and each separate phase shifter is driven by a unique waveform.

A further embodiment of any of the foregoing embodiments may additionally and/or alternatively include the multiple phase shifters are configured by adjusting the phase shifter setting, a plane wave can be presented to the radar-under-test at various oblique angles.

In accordance with the present disclosure, there is provided a test system comprising an array of radiating antenna elements with each radiating antenna element operatively connected to a combiner; at least one phase shifter operatively connected to the combiner; at least one power splitter operatively connected to the at least one phase shifter; and a signal generator operatively connected to the at least one power splitter; wherein the test system is configured to generate simultaneous plane waves.

A further embodiment of any of the foregoing embodiments may additionally and/or alternatively include each of the radiating antenna elements are configured to be operatively connected to multiple signal generators.

A further embodiment of any of the foregoing embodiments may additionally and/or alternatively include each radiating antenna element in the array is operatively connected to multiple phase shifters, and each separate phase shifter is driven by a unique waveform.

A further embodiment of any of the foregoing embodiments may additionally and/or alternatively include the test system further comprising an amplifier operatively connected to each of the at least one phase shifter, wherein the amplifier is selected from the group consisting of a variable attenuator and a variable gain amplifier.

A further embodiment of any of the foregoing embodiments may additionally and/or alternatively include the phase shifter comprises a time delay device.

A further embodiment of any of the foregoing embodiments may additionally and/or alternatively include the at least one phase shifter is configured by adjusting a phase shifter setting, a plane wave can be presented to the radar-under-test at various oblique angles.

In accordance with the present disclosure, there is provided a process for testing a radar-under-test with a test system comprising providing an array of radiating antenna elements operatively connected to a combiner; at least one phase shifter operatively connected to the combiner; an amplifier operatively connected to each of the at least one phase shifter; a power splitter operatively connected to the amplifier; and a signal generator operatively connected to the power splitter; generating simultaneous plane waves for the radar-under-test.

A further embodiment of any of the foregoing embodiments may additionally and/or alternatively include the process further comprising adjusting a phase shifter setting on the at least one phase shifter; presenting a plane wave to the radar-under-test at various oblique angles.

A further embodiment of any of the foregoing embodiments may additionally and/or alternatively include the process further comprising operatively coupling each radiating antenna element in the array to multiple phase shifters.

A further embodiment of any of the foregoing embodiments may additionally and/or alternatively include the process further comprising driving each at least one phase shifter by a unique waveform.

A further embodiment of any of the foregoing embodiments may additionally and/or alternatively include the process further comprising changing a signal waveform connected to the at least one phase shifter of each of the radiating antenna elements in the array; and shifting a radar target in range and Doppler.

A further embodiment of any of the foregoing embodiments may additionally and/or alternatively include the process further comprising generating multiple plane waves in a near-field of the radar-under-test; presenting multiple targets to the radar-under-test simultaneously.

A further embodiment of any of the foregoing embodiments may additionally and/or alternatively include the process further comprising using the test system with a single plane wave, employing the test system as an antenna measurement system; and determining an antenna under test antenna pattern.

Other details of the test system are set forth in the following detailed description and the accompanying drawings wherein like reference numerals depict like elements.

DETAILED DESCRIPTION

Figure 1:
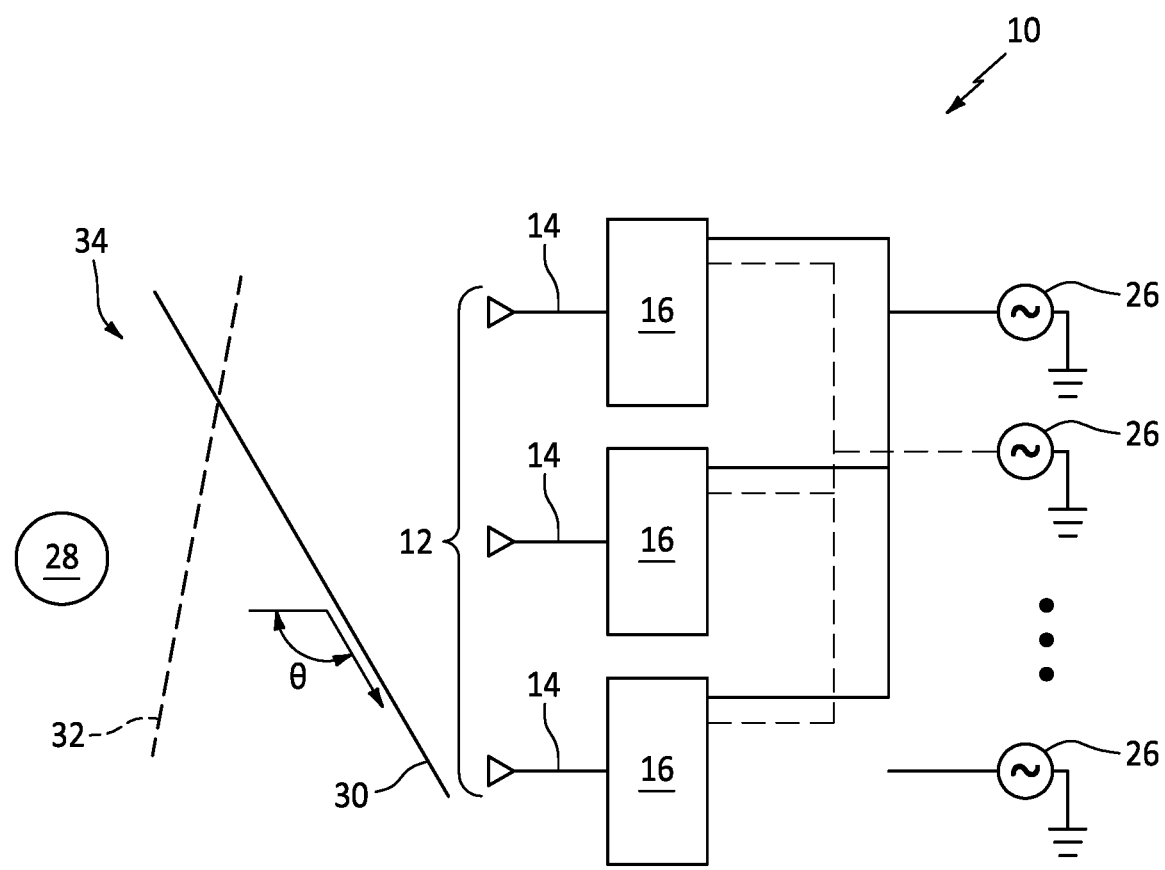
FIG. 1 is a schematic representation of an exemplary test system.
Figure 2:
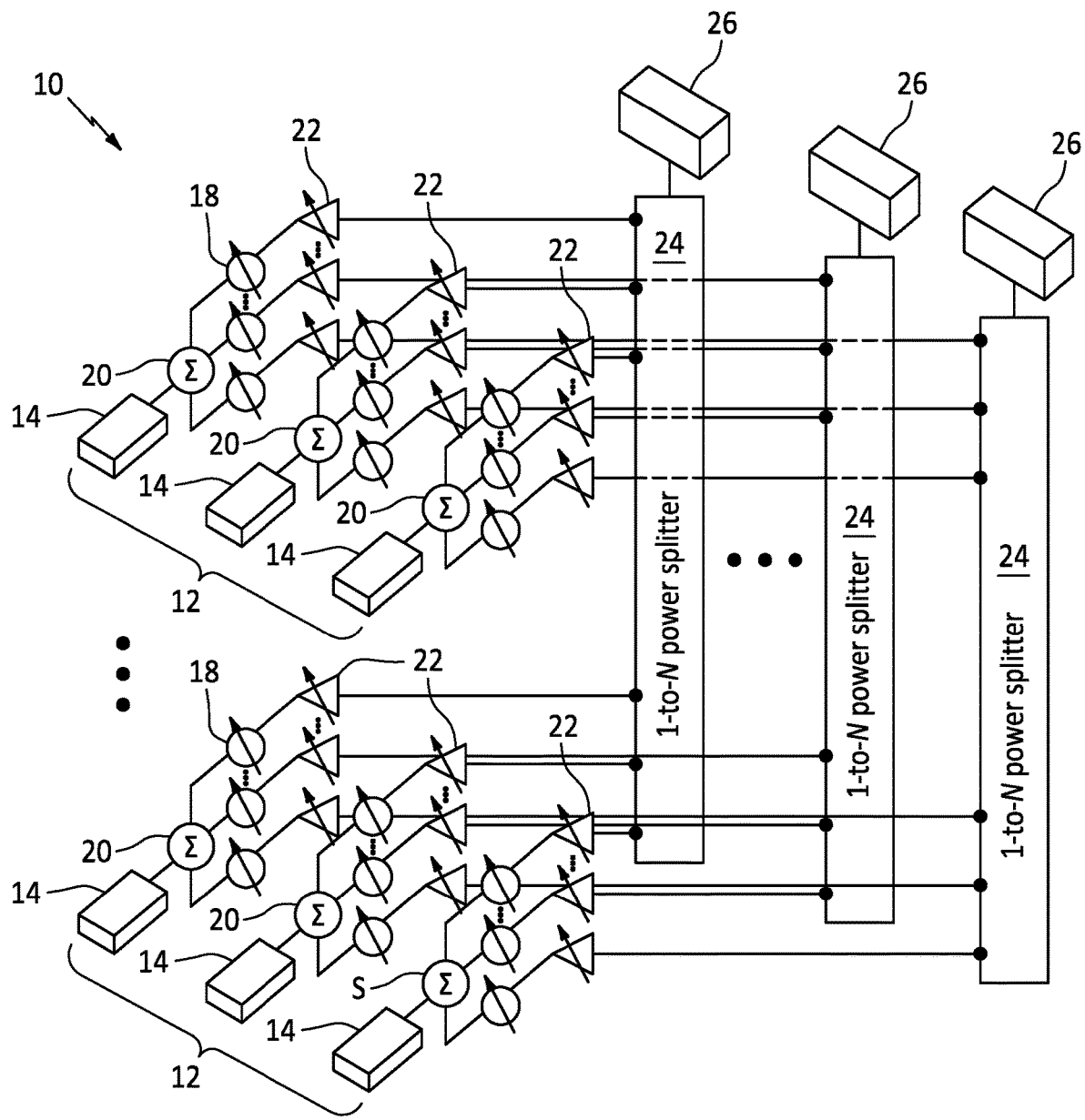
FIG. 2 is a schematic diagram of the exemplary test system

Referring now to FIG. 1 and FIG. 2, there is illustrated an exemplary near-field hardware-in-the-loop test system, or simply test system 10. The test system 10 includes an array 12 of radiating antenna elements 14. In an exemplary embodiment, the array 12 of radiating antenna elements 14 can be configured as a planar array, cylindrical array and/or spherical array and combinations thereof. An adjustment to the algorithm used to compute the amplitude and phase state of each device can accommodate the changes to the shape of the array 12.

The array 12 of radiating antenna elements 14 can include numerous radiating antenna elements 14, such as hundreds of antenna elements 14 in the array 12. Each radiating antenna element 14 can be single-polarized or dual-polarized. When using a dual-polarized element 14, it requires 2× the number of phase shifters and variable gain amplifiers (or attenuators); one set for each of two orthogonally polarized inputs. This allows for arbitrary phase relationships between the two polarized inputs to create arbitrarily polarized waveforms such as linearly polarized, Right Hand Circularly Polarized (RHCP), Left Hand Circularly Polarized (LHCP), 45 degree slant, and any other relevant wave polarization relationships.

The array 12 of radiating antenna elements 14 can be operatively connected to at least one beam former 16. In an exemplary embodiment, the beam former 16 can include a phase shifter 18. In an exemplary embodiment, the phase shifter 18 can be a time delay device. In an exemplary embodiment, the phase shifter 18 can be a Monolithic Microwave Integrated Circuit (MMIC). Such a phase shifter 18 can be a very compact form that can be rapidly reconfigured. In an exemplary embodiment, each radiating antenna element 14 in the array 12 can be connected to multiple phase shifters 18 (1 to N), and each separate phase shifter 18 is driven by a unique waveform.

As seen in FIG. 2, the antenna element 14 can be operatively connected to a combiner 20. The combiner 20 can be employed to combine the output of each of the phase shifters 18. The phase shifter 18 can be operatively connected to an amplifier 22, such as a power amplifier. In an exemplary embodiment, a variable attenuator could be substituted for a variable gain amplifier 22. The power amplifier 22 can be operatively connected to a power splitter 24. As shown, the power splitter 24 can supply multiple power amplifiers 22. The power splitter 24 can be operatively connected to a signal generator 26. It is contemplated that there can be an arrangement of multiple signal generators 26 (1 to N) as depicted in the figures operatively connected to the various antenna elements 14. In an exemplary embodiment, the beam former 16 as seen in FIG. 1 can include the phase shifter 18, the combiner 20 and the amplifier 22 as seen in FIG. 2.

In the example shown in FIG. 1, there are signal generator number 1, signal generator number 2 and signal generator number N, to signify the multiple options. Each signal generator 26 can be unique.

The test system 10 is capable of creating multiple unique targets to a radar-under-test 28. For example, as shown in FIG. 1, signal generator number 1 can produce a phase front 30 and signal generator number 2 can generate phase front 32. It is contemplated that the array 12 can be used to generate a plane wave in the radar's aperture region. The near-field hardware-in-the-loop test system 10 can present multiple targets simultaneously to the radar-under-test 28. Each radiating antenna element 14 in the array 12 can be connected to multiple phase shifters 18 (1 to N), and each separate phase shifter 18 can be driven by a unique waveform, such as a radar waveform. By changing the $n^{th}$ phase shifter 18 setting on all radiating elements, the plane wave can be presented to the radar-under-test 28 at various oblique angles θ as depicted in FIG. 1. By changing the signal waveform connected to the $n^{th}$ phase shifter 18 of each element 14, a radar target can be shifted in range and Doppler. Since each phase shifter 18 of each element 14 is connected to a unique signal generator 26, the system 10 can present a total of N unique targets to the radar-under-test 28. By setting N=1, a fast antenna measurement system is also achievable. By use of algorithms the near-field hardware-in-the-loop test system 10 can generate high quality simultaneous plane waves in the test zone of the radar-under-test 28. For example, high quality can be understood to mean that the electric field amplitude and phase ripple within the 2D area encompassing the antenna under test is less than 0.5 dB and less than 5 degrees respectively.

The test system 10 can generate N plane waves in the near-field of the radar-under-test 28; therefore, the large planar array of the test system can be within 3 to 5 wavelengths of the radar-under-test 28 and present multiple targets simultaneously. The test system 10 can take up a very small amount of floor space.

In an exemplary embodiment, by use with a single plane wave, the system 10 could be employed as an antenna measurement system to determine an antenna under test (AUT) antenna pattern. In this exemplary embodiment, instead of having multiple phase shifters and amplifiers connected to a single element, one would only have one phase shifter and one amplifier connected to the element. N=1, therefore only one plane wave could be generated at a time.

In an exemplary embodiment, one can employ time domain duplexing (TDD) to switch plane wave generator 26 elements between transmit (TX) and receive (RX). The antenna elements 14 can be connected to a switch S, and that switch S can be connected to two sets of phase shifters 18 and variable gain amplifiers 22 (or attenuators). This configuration can allow for time-domain-duplex of the array between TX and RX.

In an exemplary embodiment, one can use amplitude tapering to improve the quality of the pseudo plane wave in the test region 34. This could be accomplished by applying a different gain calculated from an amplitude taper model to each variable attenuator 22 such that elements closer to the center of the array radiate more power than elements towards the edges of the array.

Since the phase shifters 18 can be implemented as MMICs, the phase shifters 18 are very compact can be rapidly reconfigured, and therefore the targets presented to the radar-under-test 28 can be moved rapidly in the angular domain.

The test system 10 can also allow for very rapid antenna pattern measurements, since the test system could rapidly step through a number of plane waves. Initial timing estimates indicate that a full antenna pattern measurement could be performed in approximately one second.

A technical advantage of the disclosed test system can include the capacity to generate multiple high quality simultaneous plane waves in the test zone.

Another technical advantage of the disclosed test system can include each radiating antenna element in the array can be connected to multiple phase shifters and each separate phase shifter is driven by a unique waveform.

Another technical advantage of the disclosed test system can include the plane wave being presented to the radar-under-test at various oblique angles.

Another technical advantage of the disclosed test system can include a radar target that can be shifted in range and Doppler.

Another technical advantage of the disclosed test system can include by use with multiple plane waves, the system can be employed as a target generator device for use during guidance section integration. Setting the number of signal generators N equal to the number of target like objects of a relevant environment, and feeding the signal generators the output of an environment simulation allows for presentation of complex targets and clutter.

There has been provided a test system. While the test system has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. A test system comprising:
an array of radiating antenna elements, each antenna element in the array operatively connected to a beam former; and
at least one signal generator operatively connected to said beam former; wherein the test system is configured to generate simultaneous plane waves in the near-field region; wherein each radiating antenna element in the array is operatively connected to multiple phase shifters, and each separate phase shifter is driven by a unique waveform; wherein the multiple phase shifters are configured by adjusting the phase shifter setting, a plane wave can be presented to the radar-under-test at various oblique angles; wherein the test system is configured to simultaneously generate multiple plane waves having different oblique angles.

2. The test system according to claim 1, wherein said beam former is selected from the group consisting of a phase shifter, a digital attenuator, a variable gain amplifier, and combinations thereof.

3. The test system according to claim 2, wherein the beam former comprises a Monolithic Microwave Integrated Circuit.

4. The test system according to claim 1, wherein the radiating antenna element is selected from the group consisting of a single-polarized antenna element and dual-polarized antenna element.

5. The test system according to claim 1, wherein the array of radiating antenna elements is selected from the group consisting of a planar array, a cylindrical array, a spherical array and combinations thereof.

6. A test system comprising:
an array of radiating antenna elements with each radiating antenna element operatively connected to a combiner;
at least one phase shifter operatively connected to the combiner; wherein the at least one phase shifter is configured by adjusting a phase shifter setting, a plane wave can be presented to the radar-under-test at various oblique angles;
at least one power splitter operatively connected to the at least one phase shifter; and
a signal generator operatively connected to the at least one power splitter; wherein the test system is configured to generate simultaneous plane waves; wherein the test system is configured to simultaneously generate multiple plane waves having different oblique angles.

7. The test system according to claim 6, wherein each of the radiating antenna elements are configured to be operatively connected to multiple signal generators.

8. The test system according to claim 6, wherein each radiating antenna element in the array is operatively connected to multiple phase shifters, and each separate phase shifter is driven by a unique waveform.

9. The test system according to claim 6, further comprising:
an amplifier operatively connected to each of the at least one phase shifter, wherein the amplifier is selected from the group consisting of a variable attenuator and a variable gain amplifier.

10. The test system according to claim 6, wherein the phase shifter comprises a time delay device.

11. A process for testing a radar-under-test with a test system comprising:
providing an array of radiating antenna elements operatively connected to a combiner; at least one phase shifter operatively connected to the combiner; an amplifier operatively connected to each of the at least one phase shifter; a power splitter operatively connected to the amplifier; and a signal generator operatively connected to the power splitter;
adjusting a phase shifter setting on the at least one phase shifter;
presenting a plane wave to the radar-under-test at various oblique angles;
generating simultaneous plane waves for the radar-under-test; and
configuring the test system to simultaneously generate multiple plane waves having different oblique angles.

12. The process of claim 11, further comprising:
operatively coupling each radiating antenna element in the array to multiple phase shifters.

13. The process of claim 11, further comprising:
driving each at least one phase shifter by a unique waveform.

14. The process of claim 11, further comprising:
changing a signal waveform connected to the at least one phase shifter of each of the radiating antenna elements in the array; and
shifting a radar target in range and Doppler.

15. The process of claim 11, further comprising:
generating multiple plane waves in a near-field of the radar-under-test;
presenting multiple targets to the radar-under-test simultaneously.

16. The process of claim 11, further comprising:
using the test system with a single plane wave,
employing the test system as an antenna measurement system; and
determining an antenna under test antenna pattern.

* * * * *